United States Patent
Chen et al.

(10) Patent No.: US 8,466,019 B2
(45) Date of Patent: Jun. 18, 2013

(54) SEMICONDUCTOR DEVICE AND BIPOLAR-CMOS-DMOS

(75) Inventors: Chu-Feng Chen, Taipei County (TW); Chung-Ren Lao, Taichung County (TW); Pai-Chun Kuo, Hsinchu County (TW); Chien-Hsien Song, Kaohsiung (TW); Hua-Chun Chiue, Taichung (TW); An-Hung Lin, Taipei County (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 13/267,846

(22) Filed: Oct. 6, 2011

(65) Prior Publication Data

US 2012/0025308 A1    Feb. 2, 2012

Related U.S. Application Data

(62) Division of application No. 12/494,188, filed on Jun. 29, 2009, now Pat. No. 8,058,121.

(30) Foreign Application Priority Data

Jun. 30, 2008 (TW) .............................. 97124562 A

(51) Int. Cl.
*H01L 29/72* (2006.01)
(52) U.S. Cl.
USPC ........................................... 438/202; 438/309
(58) Field of Classification Search
USPC .................................... 438/202, 309
See application file for complete search history.

(56) References Cited

U.S. PATENT DOCUMENTS

2009/0026553 A1 * 1/2009 Bhuwalka et al. ............. 257/402
2009/0294841 A1 * 12/2009 Pendharkar et al. .......... 257/328

* cited by examiner

*Primary Examiner* — Edward Wojciechowicz

(57) ABSTRACT

A semiconductor device fabricating method is described. The semiconductor device fabricating method comprises forming an epitaxial layer on a substrate, wherein the epitaxial layer is the same conductive type as the substrate. A first doped region having the different conductive type from the epitaxial layer is formed in the epitaxial layer. An annealing process is performed to diffuse dopants in the first doped region. A second doped region and an adjacent third doped region are formed in the first doped region. The second doped region is a different conductive type from that of the first doped region, and the third doped region is the same conductive type as that of the first doped region. A gate structure is formed on the epitaxial layer covering a portion of the second and the third doped regions.

15 Claims, 3 Drawing Sheets

SEMICONDUCTOR DEVICE AND BIPOLAR-CMOS-DMOS

CROSS REFERENCE TO RELATED APPLICATIONS

This application is a divisional of U.S. application Ser. No. 12/494,188, filed Jun. 29, 2009, the entire disclosure of which is hereby incorporated by reference.

This Application claims priority of Taiwan Patent Application No. 97124562, filed on Jun. 30, 2008, the entirety of which is incorporated by reference herein.

BACKGROUND OF THE INVENTION

1. Field of the Invention

The present invention relates to a semiconductor device and method for fabricating the same, and in particular, to a bipolar-CMOS (complementary metal-oxide-semiconductor transistor)-DMOS (double diffused metal-oxide-semiconductor transistor) (BCD transistor) and method for fabricating the same.

2. Description of the Related Art

A bipolar-CMOS (complementary metal-oxide-semiconductor transistor)-DMOS (double diffused metal-oxide-semiconductor transistor) (hereinafter "BCD") process, which was developed by ST Microelectronics corporation, is used for system on chip (SoC) product fabrication. ST Microelectronics's BCD process, combines fabrication of bipolar, CMOS and DMOS processes for a single device.

The BCD process is used for high voltage, high power and high integration density. For requirements of high voltage, a reduced surface field (RESURF) of a device is needed. FIG. 1 is a conventional P-type BCD transistor 150. During the conventional BCD process, an N-type buried region 103 is needed to be formed in a substrate 100 and an epitaxial layer 102 by ion implantation and diffusion processes. Also, an N-type isolation region (N-ISO region) 104 is formed in the epitaxial layer 102, which is connected to the N-type buried region 103. Next, a drain region 108, a lateral diffused drain region 109 and a source region 110 are formed in a portion of the epitaxial layer 102 surrounding by the N-type buried region 103 and the N-ISO region 104. In the conventional BCD process, the drain region 108 and the surrounding lateral diffused drain region 109 are used for RESURF requirements. The lateral diffused drain region 109 has less dopant concentration than the drain region 108, thereby resulting in a high breakdown field (BVdss), increased chip area and increased on resistance (Ron). Thus, typically, conventional BCD transistors have high Ron/BVdss ratios, thereby having less reliability.

Therefore, a semiconductor device and method for fabricating the same with high breakdown field (BVdss) and low on resistance (Ron) is needed.

BRIEF SUMMARY OF INVENTION

To solve the above-described problems, a method for fabricating a semiconductor device is provided. An exemplary embodiment of a method for fabricating a semiconductor device comprises providing a substrate. Next, an epitaxial layer is formed on the substrate, wherein the epitaxial layer is the same conductive type as the substrate. A first doped region is formed in the epitaxial layer, wherein the first doped region is a different conductive type from that of the epitaxial layer. An annealing process is performed to diffuse dopants in the first doped region. A second doped region and an adjacent third doped region are respectively formed in a portion of the epitaxial layer and also in the first doped region, wherein the second doped region is a different conductive type from that of the first doped region, and the third doped region is the same conductive type as that of the first doped region. A gate structure is formed on the epitaxial layer, covering a portion of the second and the third doped regions.

An exemplary embodiment of a semiconductor device comprises a substrate. An epitaxial layer is on the substrate, wherein the epitaxial layer is the same conductive type as the substrate. A first doped region is in the epitaxial layer, wherein the first doped region is a different conductive type from that of the epitaxial layer. A second doped region and an adjacent third dope region are respectively in a portion of the epitaxial layer and in the first doped region, wherein the second doped region is a different conductive type from that of the first doped region, and the third doped region is the same conductive type as that of the first doped region. A gate structure is on the epitaxial layer, covering a portion of the second and the third doped regions.

An exemplary embodiment of a method for fabricating a bipolar-CMOS (complementary metal-oxide-semiconductor transistor)-DMOS (double diffused metal-oxide-semiconductor transistor) (BCD transistor) comprises providing a P-type substrate. A P-type epitaxial layer is formed on the P-type substrate. An N-type isolation region is formed in the P-type epitaxial layer. An annealing process is performed to diffuse dopants in the N-type isolation region. A source region and an adjacent drain region are formed in a portion of the P-type epitaxial layer and also in the N-type isolation region, wherein the drain region is a different conductive type from that of the N-type isolation region, and the source region is the same conductive type as that of the N-type isolation region. A gate structure is formed on the P-type epitaxial layer, covering a portion of the source and drain regions.

An exemplary embodiment of a bipolar-CMOS (complementary metal-oxide-semiconductor transistor)-DMOS (double diffused metal-oxide-semiconductor transistor) (BCD transistor) comprises a P-type substrate. A P-type epitaxial layer is on the P-type substrate. An N-type isolation region is in the P-type epitaxial layer. A source region and an adjacent drain region are respectively in a portion of the epitaxial layer and in the N-type isolation region. A gate structure is on the P-type epitaxial layer, covering a portion of the source and drain regions.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
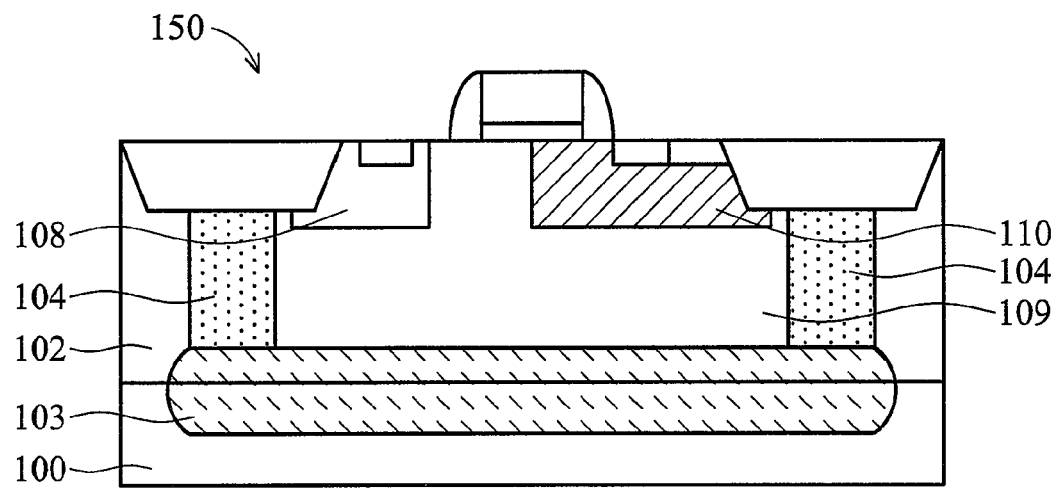
FIG. 1 is a conventional P-type BCD transistor.
Figure 2:
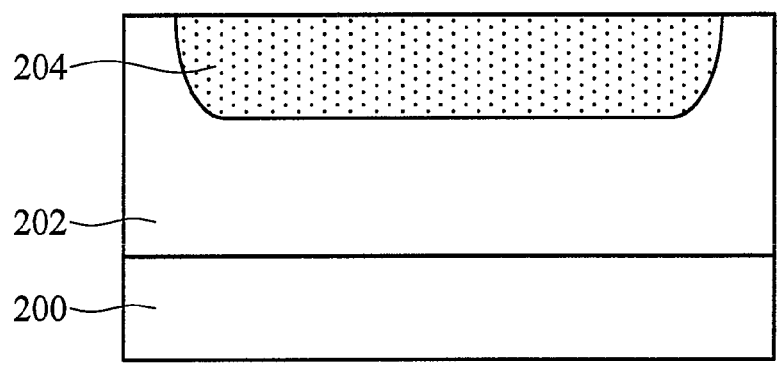
FIGS. 2 to 7 are cross sections illustrating one exemplary embodiment of steps for fabricating a semiconductor device of the invention.

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

FIGS. 2 to 7 are cross sections illustrating one exemplary embodiment of steps for fabricating a semiconductor device of the invention. In one embodiment, the semiconductor device may comprise a bipolar-CMOS (complementary metal-oxide-semiconductor transistor)-DMOS (double diffused metal-oxide-semiconductor transistor) (hereinafter "BCD transistor"). A substrate 200 is provided. In one embodiment, the substrate 200 may comprise silicon. In alternative embodiments, SiGe, bulk semiconductor, strained semiconductor, compound semiconductor, silicon on insulator (SOI), and other commonly used semiconductor substrates can be used for the substrate 200. The substrate 200 may have a desired conductive type by implanting P-type or N-type dopants. In one embodiment, the substrate 200 may be P-type substrate.

Next, an epitaxial layer 202 is formed on the substrate 200, covering the substrate 200. The epitaxial layer 202 may have the same conductive type as the substrate 200. The epitaxial layer 202 may be formed by, for example, a selective epitaxial growth process. In one embodiment, the epitaxial layer 202 is P-type layer. A first doped region 204 is then formed in the epitaxial layer 202. In one embodiment, a mask used to form an N-type isolation region (N-ISO) is used to define a formation position of the first doped region 204. Next, an ion implantation process is performed to dope dopants in the epitaxial layer 202. Therefore, the first doped region 204 is formed. In one embodiment, the first doped region may be a different conductive type from that of the epitaxial layer 202.

Figure 3:
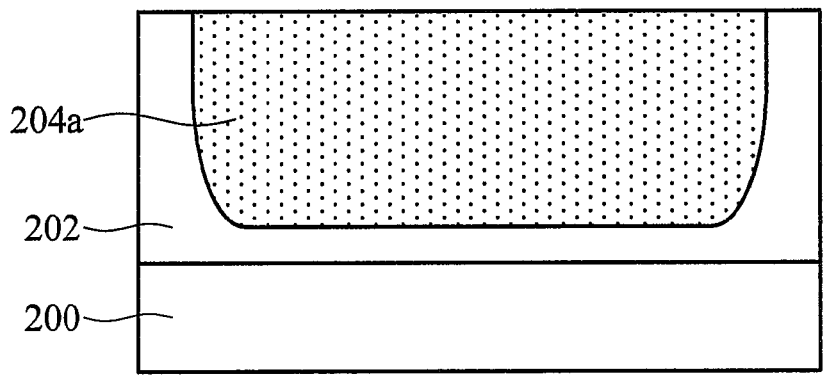

FIG. 3 illustrates formation of a diffused first doped region 204a. The diffused first doped region 204a may be formed by performing an annealing process to diffuse the dopants in first doped region 204. A boundary of the diffused first doped region 204a is substantially contained within the epitaxial layer 202. A junction depth of the diffused first doped region 204a is preferably between 1 μm and 10 μm, and more preferably 4 μm. The diffused first doped region 204a may have a dopant concentration of between $10^8$ ions/cm² and $10^{14}$ ions/cm2. In one embodiment, the diffused first doped region 204a may serve as an N-type isolation region 204a.

Figure 4:
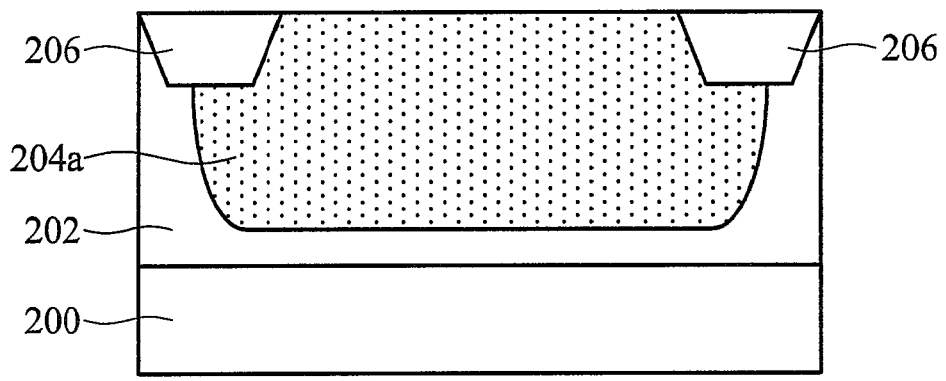

Next, as shown in FIG. 4, a plurality of shallow trench isolations (STI) 206 is formed in the epitaxial layer 202 to isolate subsequently formed semiconductor devices. The shallow trench isolations (STI) may be formed by etching the epitaxial layer 202 to form recesses. Next, a dielectric material such as a high-density plasma oxide (HDP oxide) is filled in the recesses. A planarization process such as a chemical mechanical polish (CMP) process is performed, removing the excess dielectric material to form an STI 206 in the epitaxial layer 202. The STI 206 is formed from a surface of the epitaxial layer 202 which extends into the epitaxial layer 202, occupying a portion of the boundary of the diffused first doped region 204a.

Figure 5:
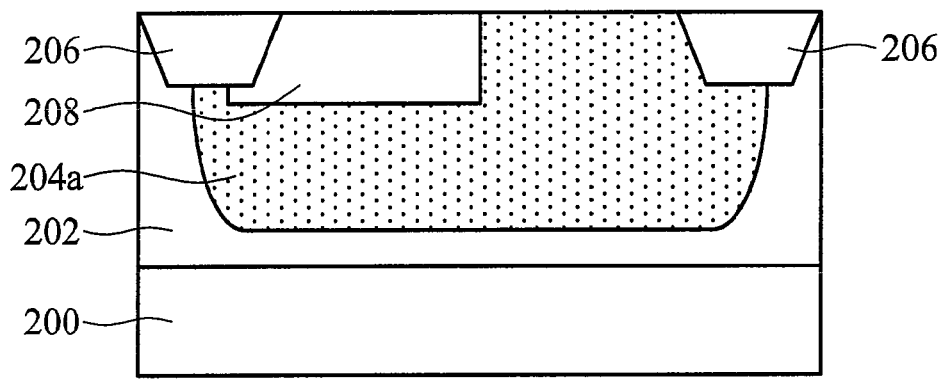

FIG. 5 illustrates formation of a second doped region 208. A second doped region 208 is formed in a portion of the epitaxial layer 202 by, for example, an ion implantation process. The second doped region 208 is in the diffused first doped region 204a, wherein the second doped region 208 is a different conductive type from that of the diffused first doped region 204a. In one embodiment, the second doped region may serve as a P-type drift region 208, which is used as a drain region of a semiconductor device. In one embodiment, after formation of the second doped region 208, an annealing process may be performed to laterally diffuse dopants in the second doped region 208. Therefore, graded doping concentration in the second doped region 208 is formed.

Figure 6:
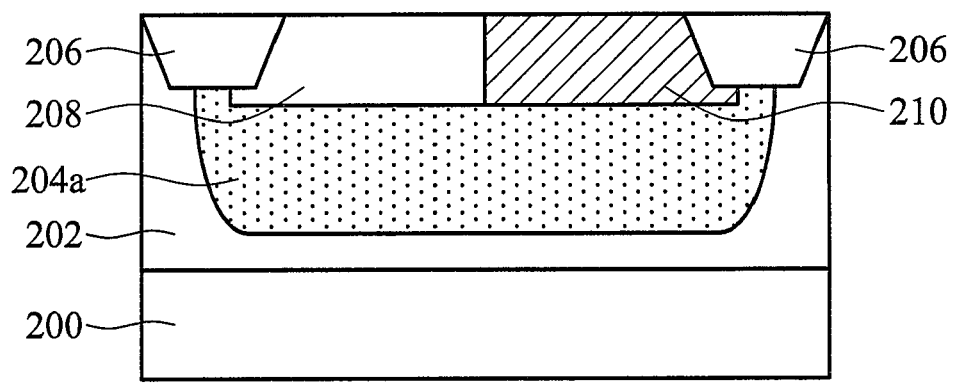

Next, referring to FIG. 6, a third doped region 210 is formed a portion of the epitaxial layer 202 by, for example, an ion implantation process. The third doped region 210 is in the diffused first doped region 204a, adjacent to the second doped region 208, wherein the third doped region 210 has the same conductive type as that of the diffused first doped region 204a. Additionally, the third doped region 210 may have a dopant concentration larger than that of the diffused first doped region 204a. In one embodiment, the third doped region 210 may serve as an N-type body region 210, which is used as a channel region and a source region of a semiconductor device. In one embodiment, after formation of the third doped region 210, an annealing process may be performed to laterally diffuse dopants in the third doped region 210. Therefore, graded doping concentration in the third doped region 210 is formed. The annealing process, which is performed after formation of the third doped region 210, may have a temperature region lower than that of the annealing process performed after formation of the second doped region 208. As shown in FIG. 6, boundaries of the second region 208 and the third region 210 are substantially contained within the diffused first doped region 204a. The second dope region 208 and the third doped region 210 may have a depth of between 1 μm and 3 μm. The process sequence of the second dope region 208 and the third doped region 210 may be switch arbitrarily and are not limited.

Figure 7:
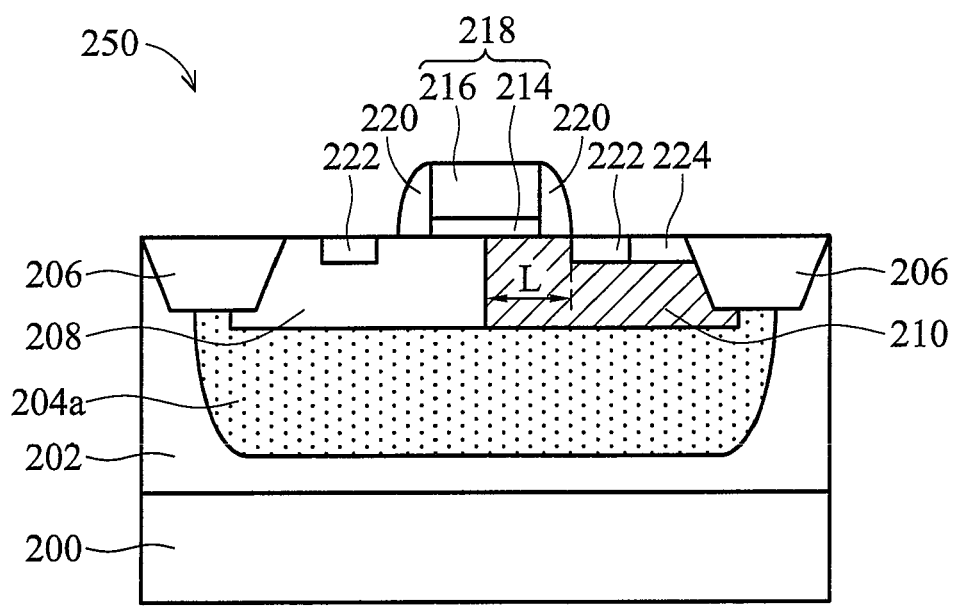

FIG. 7 illustrates formations of a gate structure 218, an insulating spacer 220, a first pick-up doped region 222 and a second pick-up doped region 224. A gate insulating layer 214 may be deposed on the epitaxial layer 202 by, for example, a thermal oxidation, chemical vapor deposition (CVD) or atomic layer CVD (ALD) process. The gate insulating layer 214 may comprise common used dielectric materials, for example, oxide, nitride, oxynitride, oxycarbide or combinations thereof. The gate insulating layer 214 may also comprise high-k (k>8) dielectric materials, for example, aluminum oxide ($Al_2O_3$), hafnium oxide ($HfO_2$), hafnium oxynitride (HfON), hafnium silicate ($HfSiO_4$), zirconium oxide ($ZrO_2$), zirconium oxynitride (ZrON), zirconium silicate ($ZrSiO_4$), yttrium oxide ($Y_2O_3$), lanthalum oxide ($La_2O_3$), cerium oxide ($CeO_2$), titanium oxide ($TiO_2$), tantalum oxide ($Ta_2O_5$) or combinations thereof. Next, a gate layer 216 may be formed on the gate insulating layer 214 by, for example, a chemical vapor deposition (CVD) process. The gate layer 216 may comprise silicon or polysilicon materials. The gate layer 216 may be doped to reduce sheet resistance. Alternatively, the gate layer 216 may comprise amorphous silicon.

Next, a patterned photo resist layer (not shown) may be formed covering the entire region to define a formation position of a gate structure 218. A portion of the gate insulating layer 214 and the gate layer 216 not covered by the patterned photo resist layer are removed by an anisotropic etching process to form the gate structure 216 on the epitaxial layer 202. Next, the patterned photo resist layer is removed. As shown in FIG. 7 the gate structure 218 may cover a portion of the second doped region 208 and the third doped region 210, wherein the gate structure 218 and the third doped region 210 may have an overlapping length L serving as a channel length L of a semiconductor device.

Next, an insulating layer may be conformably formed on the epitaxial layer 202 and the gate structure 218 by a thin film deposition process comprising a chemical vapor deposition (CVD) process. An anisotropic etching process is then performed to form insulating spacers 220 on sidewalls of the gate structure 218.

Next, an ion implantation process is performed to form first pick-up regions 222 respectively in a portion of the second doped region 208 and the third doped region 210 not covered by the gate structure 218. Another ion implantation process is then performed to form a second pick-up region 224 in a portion of the third doped region 210 not covered by the gate structure 218, adjacent to the first pick-up region 222. The first pick-up region 222 may have the same conductive type as the second doped region 208 but different conductive type from that of the third doped region 210. In one embodiment, the first pick-up regions 222 may serve as pick-up regions of a drain region and a P-type drift region of a semiconductor device. And the first pick-up regions 222 may be P-type regions. The second pick-up region 224 may have a different conductive type from that of the second doped region 208 but the same conductive type as that of the third doped region 210. In one embodiment, the second pick-up region 224 may serve as a pick-up region of an N-type body region of a semiconductor device. Additionally, the second pick-up region 224 may be an N-type region. Thus, one exemplary embodiment of a semiconductor device 250 of the invention is completely formed.

One exemplary embodiment of the semiconductor device 250 may serve as a P-type BCD transistor. In the semiconductor device 250, a first doped region 204 serving as an N-type isolation region (N-ISO region) may be formed in the epitaxial layer 202. The diffused first doped region 204a is formed, after performing an annealing process, which may serve as an N-type bulk region to isolate the semiconductor device 250. The diffused first doped region 204a combined with the third doped region 210, which serves as an N-type body region, may have a larger dopant concentration in a portion adjacent to a surface of the epitaxial layer 202. Thus, allowing the subsequent formation of the second doped region 208, which serves as a P-type drift region, to increase dopant concentration and reduce the junction depth thereof. Additionally, the second doped region 208 may be formed using only a single mask process step. Due to shallower junction depths of the diffused first doped region 204a and the third doped region 210, the second doped region with a larger dopant concentration, may efficiently reduce surface field of the semiconductor device. The diffused first doped region 204a may reduce a lateral size of the second doped region 208, increasing dopant concentration thereof without forming an additional N-type buried region like for that of the conventional P-type BCD transistor. Therefore, one exemplary embodiment of the diffused first doped region 204a may maintain drain-source breakdown voltage (BVdss) of the semiconductor device 250, while reducing the pitch size of the semiconductor device 250. Thus, on resistance (Ron) of the semiconductor device 250 may be reduced.

By forming the diffused first doped region 204a surrounding the second doped region 208 and the third doped region 210, and adjusting the dopant concentration of the third doped region 210, a Ron/BVdss ratio of the semiconductor device 250 is efficiently reduced. Therefore, the resulting semiconductor device 250 may resist higher operation voltage, thereby allowing cell size thereof to be reduced. Meanwhile, the number of masks and fabrication cost may be further reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a substrate;
an epitaxial layer on the substrate, wherein the epitaxial layer is the same conductive type as the substrate;
a first doped region in the epitaxial layer, wherein the first doped region is a different conductive type from that of the epitaxial layer;
a second doped region and an adjacent third dope region respectively in the first doped region, wherein the second doped region, which directly contacts both the first and third doped regions, has a different conductive type from the first doped region, and the third doped region, which directly contacts both the first and second doped regions, has the same conductive type as the first doped region, and wherein the second doped region and the third doped region are a drain region and a source region, respectively; and
a gate structure on the epitaxial layer, covering a portion of the second and the third doped regions.

2. The semiconductor device as claimed in claim 1, further comprising:
two fourth doped regions respectively in a portion of the second and third doped regions not covered by the gate structure, wherein the fourth doped regions have a different conductive type from the first doped region.

3. The semiconductor device as claimed in claim 2, further comprising:
a fifth doped region in a portion of the third doped region not covered by the gate structure, adjacent to the fourth doped region, wherein the fifth doped region has a different conductive type from the second doped region and the fourth doped regions.

4. The semiconductor device as claimed in claim 1, wherein boundaries of the second and third doped regions are substantially contained within the first doped region, respectively.

5. The semiconductor device as claimed in claim 1, wherein the first doped region has a dopant concentration substantially less than that of the third doped region.

6. The semiconductor device as claimed in claim 1, wherein the first doped region has a dopant concentration of between $10^8$ ions/cm$^2$ and $10^{14}$ ions/cm$^2$.

7. The semiconductor device as claimed in claim 1, wherein a boundary of the diffused first doped region is substantially in the epitaxial layer.

8. The semiconductor device as claimed in claim 1, wherein the diffused first doped region has a depth of between 1 μm and 10 μm.

9. The semiconductor device as claimed in claim 1, wherein the diffused first doped region has a depth of between 1 μm and 10 μm.

10. The semiconductor device as claimed in claim 1, wherein the semiconductor device is a bipolar-CMOS (complementary metal-oxide-semiconductor transistor)-DMOS (double diffused metal-oxide-semiconductor transistor) (BCD transistor).

11. A bipolar-CMOS (complementary metal-oxide-semiconductor transistor)-DMOS (double diffused metal-oxide-semiconductor transistor) (BCD transistor), comprising:
a P-type substrate;
a P-type epitaxial layer on the P-type substrate;
an N-type isolation region in the P-type epitaxial layer;
a source region and an adjacent drain region respectively in the N-type isolation region, wherein the drain region, which directly contacts both the N-type isolation region and the source region, has a different conductive type from the N-type isolation region, and the source region, which directly contacts both the N-type isolation region and the drain region, has the same conductive type as the N-type isolation region; and a gate structure on the P-type epitaxial layer, covering a portion of the source and drain regions.

12. The BCD transistor as claimed in claim 11, further comprising:

two P-type pick-up regions respectively on the source and drain regions not covered by the gate structure.

13. The BCD transistor as claimed in claim 12, further comprising:

an N-type pick-up region on the source region not covered by the gate structure, adjacent to the P-type pick-up region.

14. The BCD transistor as claimed in claim 11, wherein the drain region is P-type region.

15. The BCD transistor as claimed in claim 11, wherein the source region is N-type region.

* * * * *